United States Patent
Mu

(10) Patent No.: US 8,965,322 B2
(45) Date of Patent: Feb. 24, 2015

(54) LOW NOISE AMPLIFIER

(75) Inventor: Fenghao Mu, Hjärup (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 8 days.

(21) Appl. No.: 13/992,804

(22) PCT Filed: Dec. 9, 2011

(86) PCT No.: PCT/EP2011/072333
§ 371 (c)(1),
(2), (4) Date: Jul. 12, 2013

(87) PCT Pub. No.: WO2012/080126
PCT Pub. Date: Jun. 21, 2012

(65) Prior Publication Data
US 2013/0281043 A1 Oct. 24, 2013

Related U.S. Application Data

(60) Provisional application No. 61/425,901, filed on Dec. 22, 2010.

(30) Foreign Application Priority Data

Dec. 16, 2010 (EP) .................................... 10195354

(51) Int. Cl.
*H04B 1/10* (2006.01)
*H03F 1/22* (2006.01)
(Continued)

(52) U.S. Cl.
CPC ...... *H03F 3/193* (2013.01); *H03F 2203/45631* (2013.01); *H03F 2200/541* (2013.01);
(Continued)

(58) Field of Classification Search
CPC .................... H03F 2200/294; H03F 2200/372; H03F 2200/451; H03F 2200/153; H03F 2200/534; H03F 2200/537; H03F 2200/541; H03F 2200/06; H03F 2203/453886; H03F 2203/45638; H03F 2203/45731; H03F 2203/45546; H03F 1/26; H03F 1/342; H03F 1/347; H03F 1/083; H03F 3/189; H03F 3/191; H03F 3/195; H03G 3/20
USPC ................... 455/63.1, 67.13, 232.1, 296, 311; 330/75, 291
See application file for complete search history.

(56) References Cited

U.S. PATENT DOCUMENTS 5,650,748 A 7/1997 Johnston et al.
6,026,286 A * 2/2000 Long ............................. 455/327
(Continued)

FOREIGN PATENT DOCUMENTS

| EP | 2148433 A1 | 1/2010 |
|---|---|---|
| GB | 1242752 A | 8/1971 |
| GB | 1271509 A | 4/1972 |

OTHER PUBLICATIONS

Van Hartingsveldt, HF Low Noise Amplifiers with Integrated Transformer Feedback, Circuits and Systems, 2002. ISCAS 2002. IEEE International Symposium on May 26-29, 2002, pp. 401-408, II-815-II-818 vol. 2, IEEE, Phoenix-Scottsdale, AZ.

(Continued)

*Primary Examiner* — Quochien B Vuong
(74) *Attorney, Agent, or Firm* — Coats & Bennett, PLLC

(57) ABSTRACT

A low noise amplifier comprises at least one amplifying transistor (Ts1; Ts2) configured in a common source configuration to receive an input signal (RFin) at a gate terminal and provide an amplified signal at a drain terminal and at least one feedback path arranged to couple a part of the amplified signal back to the gate terminal and comprising a feedback impedance. The low noise amplifier further comprises a self-coupled step-up transformer having at least one primary winding (Lp) connected to a supply voltage (Vdd) and the drain terminal of the at least one amplifying transistor and at least one self-coupled secondary inductor winding (Lf1; Lf2) arranged in the feedback path. The low noise amplifier provides a better suppression for out-band interference and at the same time it has a wider input match bandwidth, decent conversion gain and decent noise figure without increasing power consumption.

18 Claims, 7 Drawing Sheets

(51) Int. Cl.
H03F 1/34 (2006.01)
H03F 3/45 (2006.01)
H03F 3/193 (2006.01)

(52) U.S. Cl.
CPC ............... *H03F2203/45386* (2013.01); *H03F 2203/45554* (2013.01); *H03F 2203/45522* (2013.01); *H03F 2203/45528* (2013.01); *H03F 2203/45516* (2013.01); *H03F 2203/45544* (2013.01); *H03F 2203/45621* (2013.01); *H03F 1/223* (2013.01); *H03F 2200/09* (2013.01); *H03F 2200/294* (2013.01); *H03F 1/347* (2013.01); *H03F 2203/45394* (2013.01); *H03F 3/45179* (2013.01); *H03F 2203/45731* (2013.01); *H03F 2200/06* (2013.01); *H03F 2203/45662* (2013.01); *H03F 2203/45638* (2013.01); *H03F 2203/45591* (2013.01)
USPC .... 455/311; 455/63.1; 455/67.13; 455/232.1; 330/291

(56) References Cited

U.S. PATENT DOCUMENTS

| | | | |
|---|---|---|---|
| 6,586,993 B2 * | 7/2003 | Macedo | 330/51 |
| 7,339,436 B2 * | 3/2008 | Fu et al. | 330/75 |
| 7,489,192 B2 * | 2/2009 | Vitzilaios et al. | 330/79 |
| 7,554,397 B2 * | 6/2009 | Vitzilaios et al. | 330/149 |
| 7,633,344 B2 * | 12/2009 | Yamaguchi | 330/291 |
| 7,737,783 B2 | 6/2010 | Yamaguchi | |
| 8,149,053 B2 * | 4/2012 | Crand | 330/188 |
| 2010/0219890 A1 | 9/2010 | Crand | |

OTHER PUBLICATIONS

Cassan, A 1-V Transformer-Feedback Low-Noise Amplifier for 5-GHz Wireless LAN in 0.18-um CMOS, Solid-State Circuits, IEEE Journal, Mar. 2003, pp. 427-435, vol. 38, No. 3, IEEE.

Reiha, Ultra-Wideband Low-Noise Amplifier Design Using Reactive Feedback, In ProRISC 2004: Proceedings of the program for research on integrated systems and circuits, 2004, pp. 585-588, Electronics Research Laboratory/DIMES, Utrecht: STW Technology Foundation, Faculty of EEMCS, TU Delft, Delft, The Netherlands.

* cited by examiner

LOW NOISE AMPLIFIER

TECHNICAL FIELD

The invention relates to a low noise amplifier for use in e.g. a radio frequency front end receiver.

BACKGROUND

In radio frequency or wireless communication systems, a radio frequency (RF) receiver is a fundamental building block. Modern portable receiver design normally is implemented in a manner of directly down-conversion, where a low noise amplifier and a mixer are employed.

Designing a low noise amplifier and a mixer is difficult due to the multiple performance requirements, such as high linearity, large conversion gain, low noise figure, wider input match bandwidth, as well as low power consumption, etc. These requirements often conflict with each other, making a design more challenging.

A recently arisen design challenge in mobile platform design comes from an idea to remove SAW filter at front of a low noise amplifier for receiving GSM signals, and the main motivation is reducing cost. Other GSM users in the neighborhood of a user equipment at a distance about one meter can deliver as high as 1 mW RF power to the user equipment, i.e, 0 dBm at the low noise amplifier input port. To remove the SAW filter, the low noise amplifier must be able to handle this power level without suffering compression which will cause inter-modulation among wanted signals and unwanted block or interference signals.

Different types of low noise amplifiers exist, but they are typically not able to handle the above-mentioned interference levels, e.g. due to nonlinearities or too high voltage gain. Typically, extra high linearity is required for suppressing out-band block/interference signals to deal with the very strong interference level, such as 0 dBm at the RF input.

As an example, common source and common gate low noise amplifier structures cannot meet this requirement, because the interference signal swing is too high so that it creates nonlinearities at different nodes, such as input nonlinearity, interconnection nonlinearity or output nonlinearity.

Input nonlinearity can be improved by employing a differential low noise amplifier structure, and reducing the input impedance can reduce the input voltage swing. Feedback can also help to enlarge the linear region. However, output nonlinearity is difficult to deal with. To keep required linearity, the low noise amplifier output voltage swing must be low. Another difficult issue is the input match in the common source and common gate structure, as it has a very narrow bandwidth given acceptable input match. Adding a feedback path from the output to the input can improve the input matching, but it requires higher voltage gain at the output node. Otherwise, for the input matching the feedback resistance has to be small, leading to large contribution to noise figure due to the thermal noise of the feedback resistance. Increasing voltage gain of the low noise amplifier allows using a larger feedback resistance. Thus the noise contribution from the feedback resistance is reduced, but it directly contradicts with reducing the voltage swing at the output node to meet linearity requirement.

Common gate low noise amplifier has better linearity than common source and common gate low noise amplifier and good input matching for wide band, but the power gain is not enough. When connected to a passive mixer, the radio frequency front-end does not provide enough power conversion gain, and as a consequence other circuitries, like low pass filters, connected to the front-end will still contribute significant noise to the receiver chain. It is even worse for narrow band wireless communication like GSM, as the flicker noise in the low pass filter is usually very high. So basically, common gate low noise amplifier is also not suitable for the GSM case due to its high noise figure.

SUMMARY

Therefore, it is an object of embodiments of the invention to provide a high linearity low noise amplifier that provides a better suppression for out-band interference and at the same time has a wider input match bandwidth, decent conversion gain and decent noise figure without increasing power consumption.

According to embodiments of the invention the object is achieved in a low noise amplifier comprising at least one amplifying transistor configured in a common source configuration to receive an input signal at a gate terminal and provide an amplified signal at a drain terminal; and at least one feedback path arranged to couple a part of said amplified signal back to said gate terminal and comprising a feedback impedance. The low noise amplifier further comprises a self-coupled step-up transformer having at least one primary winding connected to a supply voltage and the drain terminal of the at least one amplifying transistor and at least one self-coupled secondary inductor winding arranged in said feedback path.

The self-coupled step-up transformer keeps low voltage gain for the low noise amplifier output to reach excellent linearity but boosts the feedback voltage gain in a feedback path which allows a large feedback resistor for input matching. This can be achieved even with a low supply voltage.

The low noise amplifier may further comprise a tunable capacitor coupled to form a resonant circuit having a pre-defined resonant frequency with said at least one primary winding. In this way the low noise amplifier can be tuned to the wanted RF frequency of the receiver.

Each feedback path may further comprise a transistor configured as a source follower. This increases the gain of the low noise amplifier and gives a better noise figure.

Each feedback path may further comprise a capacitor providing AC coupling in the feedback path. This ensures together with a bias voltage that the circuit can be tuned to a proper operation point for the transistors.

In one embodiment, a source terminal of each amplifying transistor is connected to ground through an inductor. This provides current feedback to the low noise amplifier, which helps to improve its linearity.

The self-coupled step-up transformer may be implemented as a metal stack with primary and secondary windings stacked one over the other. In this way there is no extra space required for the windings.

In one embodiment, the low noise amplifier is a differential amplifier having two amplifying transistors configured in a common source configuration, each having a feedback path, and that the self-coupled step-up transformer has a primary winding with a center tap connected to a supply voltage and two self-coupled inductor windings, each self-coupled inductor winding being arranged in one of said feedback paths. This improves the linearity of the amplifier.

In this case, the low noise amplifier may further comprise a balun circuit configured to convert a single ended input signal to differential signals and to supply the differential signals to the gate terminals of the amplifying transistors.

Further, in this embodiment the low noise amplifier may be configured to shift operation status from class A to class AB in presence of large RF interference.

According to one aspect, a radio frequency front end receiver is provided, comprising a low noise amplifier according to what is demonstrated herein.

BRIEF DESCRIPTION OF THE DRAWINGS

Embodiments of the invention will now be described more fully below with reference to the drawings, in which.

DETAILED DESCRIPTION OF EMBODIMENTS

Figure 1:
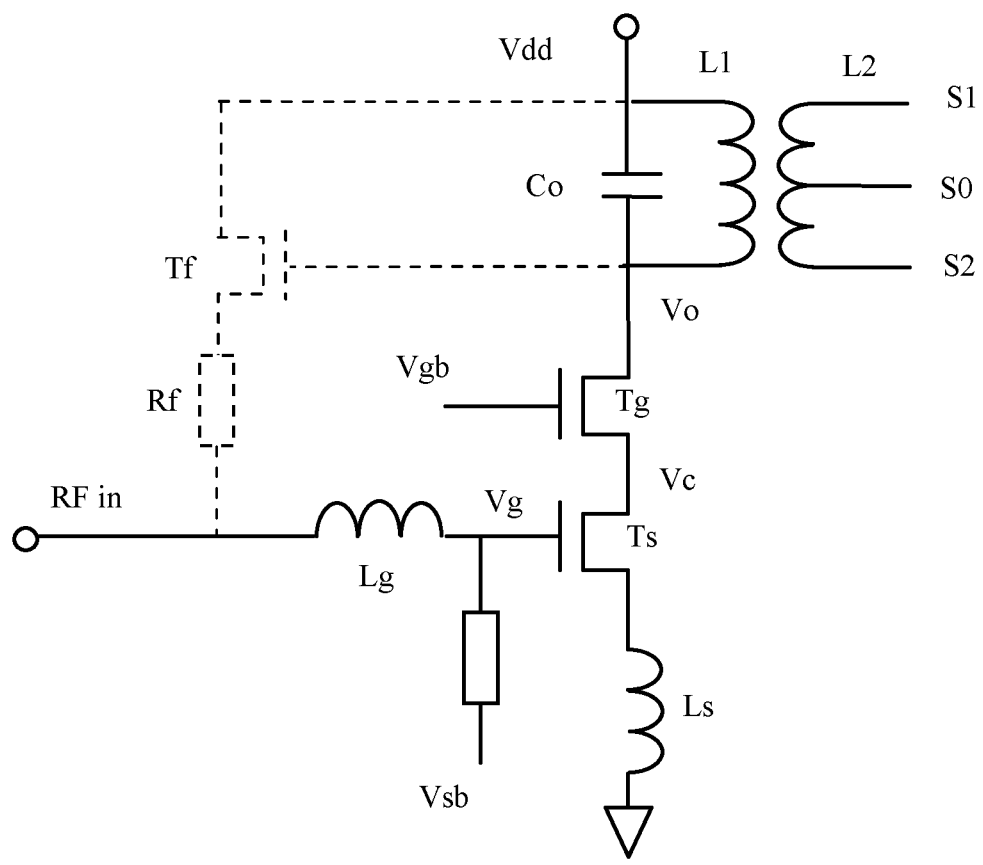
FIG. 1 shows a stacked common source and common gate low noise amplifier structure.

FIG. 1 shows a stacked common source and common gate low noise amplifier structure. The name is based on the use of the two transistors Ts and Tg, of which transistor Ts is arranged in a common source configuration and Tg is arranged in a common gate configuration. The input signal RFin to the low noise amplifier is connected to the gate terminal of transistor Ts via an inductor Lg, and the gate is further connected to a bias voltage Vsb through an impedance. The transistors Ts and Tg are connected to each other in the interconnection node Vc. The output node Vo is connected to a capacitor Co coupled in parallel to a primary inductor winding L1 of a balun, which is a transformer arranged to convert the single-ended (unbalanced) signals to differential signals that are balanced about ground. The secondary inductor winding L2 has a center tap S0 and two differential output taps S1 and S2. The capacitor Co and the primary inductor winding L1 are tuned to the wanted frequency of the low noise amplifier.

Sometimes, as mentioned above, extra high linearity is required for suppressing out-band block/interference signals to deal with a very strong interference level, such as 0 dBm at the RF input. It is not possible for the architecture shown in FIG. 1 to meet this requirement, because the interference signal swing is too high so that it creates three nonlinearities as follows 1) Input nonlinearity: In the input node Vg the interference signal forces the gate in the common source transistor Ts to shift into the nonlinear region.

2) Interconnection nonlinearity: In the interconnection node Vc, the amplified interference signal causes nonlinearity for both common source and common gate transistors.

3) Output nonlinearity: In the output node Vo, the further amplified interference signal destroys linearity in output signal.

Input nonlinearity can be improved 3 dB by employing differential low noise amplifier structure. Reducing the input impedance can reduce the input voltage swing. Feedback can also help to enlarge the linear region. Interconnection nonlinearity will disappear if the common gate stage is removed.

However, the remaining issue, i.e. the output nonlinearity is more difficult to deal with. To keep required linearity, the low noise amplifier output voltage swing must be low. Another difficult issue is the input match in the common source and common gate structure shown in FIG. 1, as it has a very narrow bandwidth given acceptable input match.

Adding a source follower stage through transistor Tf and Rf and a feedback path, plotted in the dash line, from the output to input can improve the input matching, but it requires higher voltage gain at node Vo; otherwise for the input matching the resistance of Rf has to be small, leading to large contribution to noise figure due to the thermal noise of Rf. Increasing voltage gain of the low noise amplifier allows using a larger Rf, thus the noise contribution from Rf is reduced, but it directly contradicts with reducing the voltage swing at node Vo to meet linearity requirement.

As mentioned above, also common gate low noise amplifiers are not suitable for the described GSM case with high requirements for suppressing strong out-band interference signals.

A different radio frequency front-end is described in the following. It includes an input balun, a low noise amplifier, a self-coupled step-up transformer, a passive mixer and low pass filters. A self-coupled transformer is a transformer in which one end of a primary winding is electrically connected to one end of a secondary winding. The self-coupled step-up transformer keeps low voltage gain for the low noise amplifier output to reach excellent linearity but boost the feedback voltage gain in a feedback path which allows a large feedback resistor for input matching. The low noise amplifier is biased so that the current consumption will automatically be adapted at different RF input signal power levels, extending the linearity effectively.

The radio frequency front-end uses very high linearity low noise amplifier and mixer design using low supply voltage. The compression point demand is larger than 0 dBm for out-band interference, and in normal case its noise figure should be low enough to compete with sophisticated low noise amplifier design.

Figure 2:
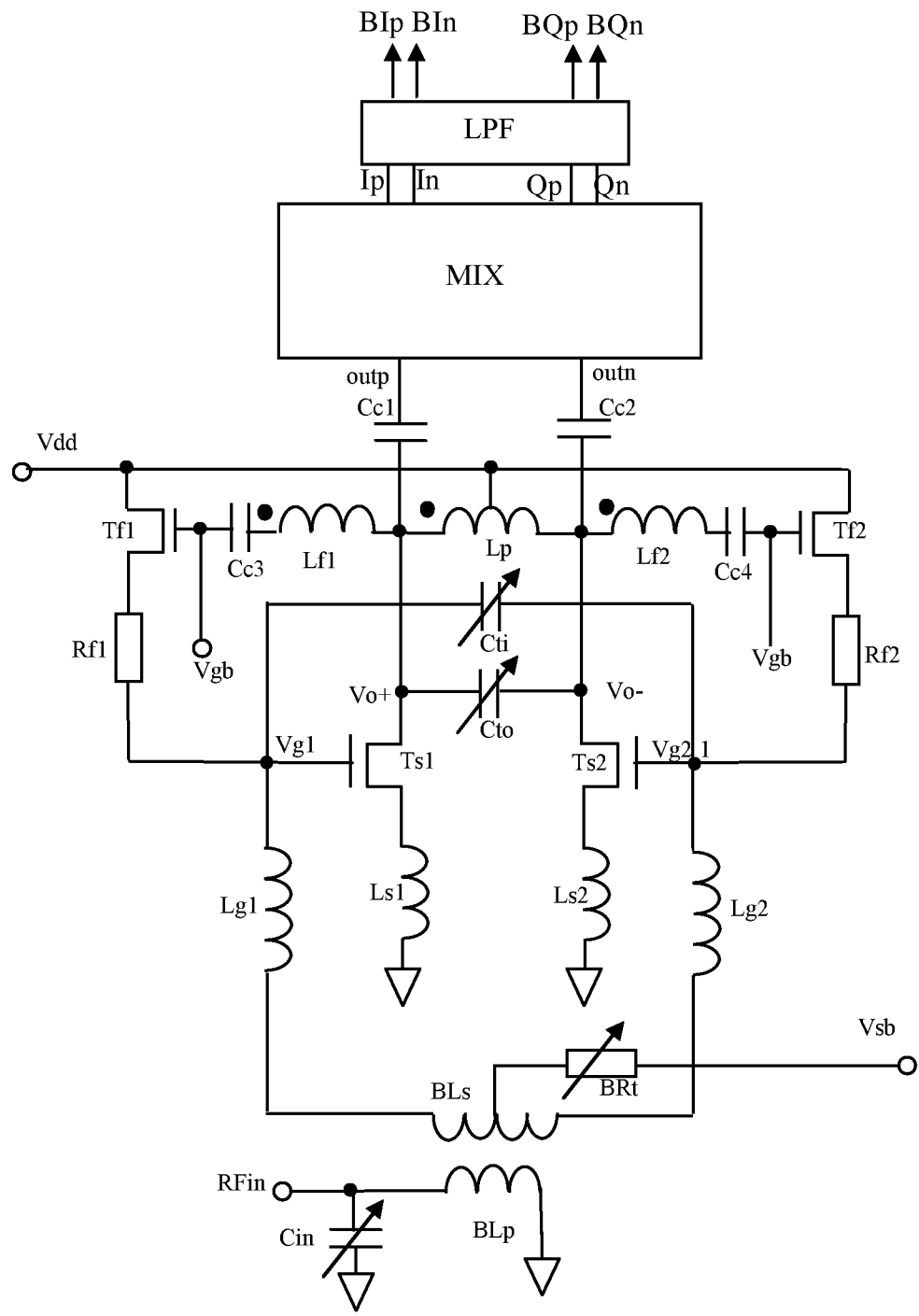
FIG. 2 shows a first embodiment of an RF receiver front-end with a differential low noise amplifier utilizing a self-coupled transformer.

An embodiment of a basic structure of an RF receiver front-end includes a differential low noise amplifier stage, a passive mixer (MIX) and a low pass filter (LPF) and is shown in FIG. 2.

An input balun is build with the primary inductor winding BLp and the secondary inductor winding BLs having a center tap. The input RF signal RFin is connected to the balun input at the primary winding BLp, and the tunable shunt capacitor Cin is used to compensate return reflection coefficient. The balun center tap is connected to a bias voltage Vsb through a tunable impedance BRt. Vsb can be considered as an AC ground. The tunable impedance BRt is employed to remove the imbalance introduced by the balun when it performs a conversion from a single-end signal to differential signals.

The differential output signals at input balun secondary winding are fed to a differential pair of transistor Ts1 and Ts2 configured in a common source connection through inductors Lg1 and Lg2. The tunable capacitor Cti is connected to the nodes Vg1 and Vg2, i.e, the gate inputs of the low noise amplifier, to resonate at a wanted RF frequency of the receiver. The source nodes of transistors Ts1 and Ts2 are connected to ground through the source degeneration inductors Ls1 and Ls2, which provide current feedback to the low noise amplifier. This current feedback helps to improve linearity of the low noise amplifier. The differential outputs, Vo+ and Vo−, of the transistors Ts1 and Ts2 are loaded by a primary inductor winding Lp with its center tap connected to the power supply Vdd. The tunable capacitor Cto is connected to the Vo+ and Vo−, also tuned at the wanted RF frequency of the receiver. The low noise amplifier outputs Vo+ and Vo− then are coupled to the passive mixer MIX via the capacitors Cc1 and Cc2.

To improve input match bandwidth, differential feedback is formed via two transistors Tf1 and Tf2 configured as source followers and feedback impedance Rf1 and Rf2. The impedance seen from Vg1 or Vg2 can be calculated by Rf1/(1+Va), where Va is the voltage gain of the low noise amplifier. As the real part Re{Rf1} of the impedance Rf1 will have a contribution to noise at low noise amplifier input nodes due to its thermal noise, one expect to use large Re{Rf1}. To match the input impedance, which usually is very low to guarantee that input nodes do not come into the nonlinear region, a large voltage gain is expected from the low noise amplifier. However, large voltage gain forces the output signals entering the nonlinear region.

In order to solve this, a self-coupled step-up transformer is used, which consists of the mentioned symmetrical Lp with the center tap, and two self-coupled secondary step-up inductor windings Lf1 and Lf2. Each of the windings Lf1 and Lf2 are connected to an end of the primary winding Lp, thus making the transformer self-coupled. In this way the voltage gain in the feedback path is boosted without damaging the low noise amplifier outputs linearity because the output swing of the low noise amplifier is kept low. The use of step-up windings allows the use of a large feedback resistor. The capacitors Cc3 and Cc4 are used for AC coupling. Vgb is a bias voltage, and it can be tuned to a proper operation point for Ts1, Ts2, Tf1 and Tf2. Of course, we can separate DC coupled biasing method by inserting AC coupling capacitors.

The transistors Ts1, Ts2, Tf1 and Tf2 can typically be nmos transistors. However, although the terminals of the transistors are designated as gate, drain and source terminals in the above and in the following, it is noted that bipolar transistors, in which the terminals are correspondingly designated as base, collector and emitter terminals, can be used as well. Thus in the present application the terms gate, drain and source terminals are intended to also cover the corresponding base, collector and emitter terminals of bipolar transistors.

Figure 3:
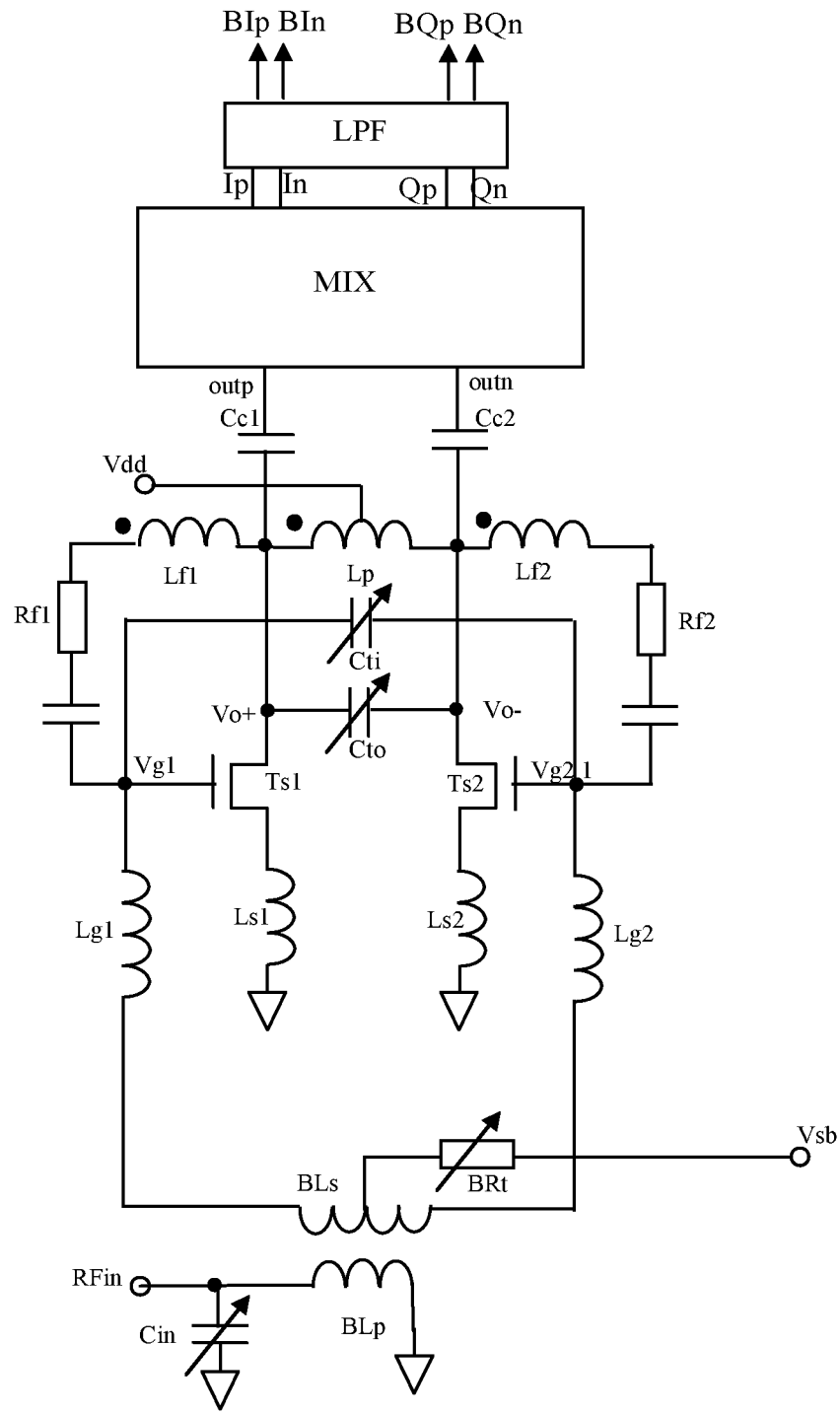
FIG. 3 shows a second embodiment of an RF receiver front-end with a differential low noise amplifier utilizing a self-coupled transformer.

A variation of the above-mentioned circuitry can be seen from FIG. 3, where the two source followers Tf1 and Tf2 are removed. Comparing with FIG. 2, the feedback path shares low noise amplifier output signal current. Therefore the gain of the low noise amplifier is reduced a bit. On the other hand, it does not need DC current in the source followers as shown in FIG. 2. Also the feedback path becomes a pure passive linear network. As a consequence, the circuitry seen in FIG. 3 can provide even a bit better linearity than the circuitry seen in FIG. 2, but noise figure and conversion gain are a bit worse.

Considering the above mentioned circuitries seen in FIG. 2 and FIG. 3, the inductors, Lg1 and Lg2 connected to the gates of transistors Ts1 and Ts2 can be removed if the inductance of the secondary windings of the input balun is large enough. To reduce the number of components used in the front-end, also the source degeneration inductors Ls1 and Ls2 can be removed if the feedback path provides enough feedback. An example of removed inductors Lg1, Lg2 Ls1 and Ls2 is plotted in FIG. 4.

Figure 4:
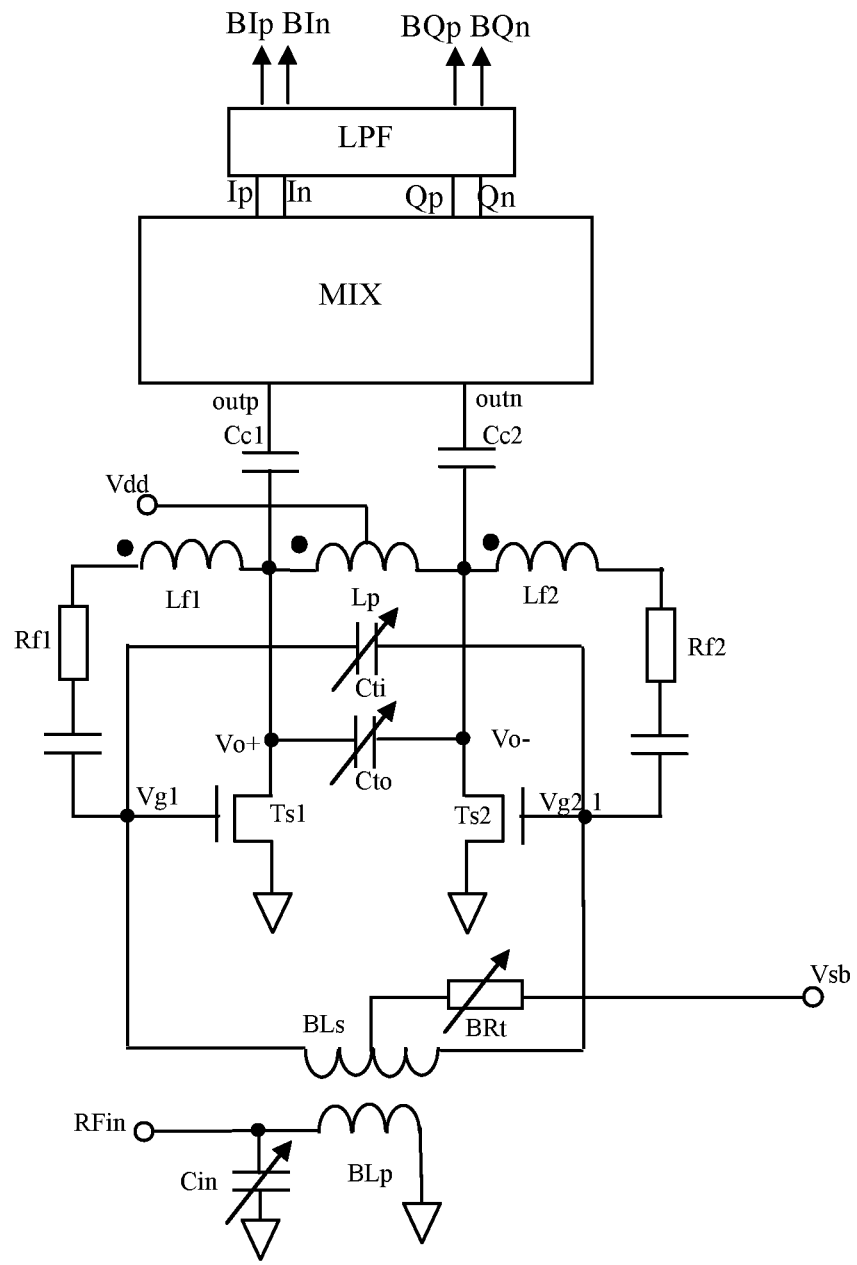
FIG. 4 shows a third embodiment of an RF receiver front-end with a differential low noise amplifier utilizing a self-coupled transformer.
Figure 5:
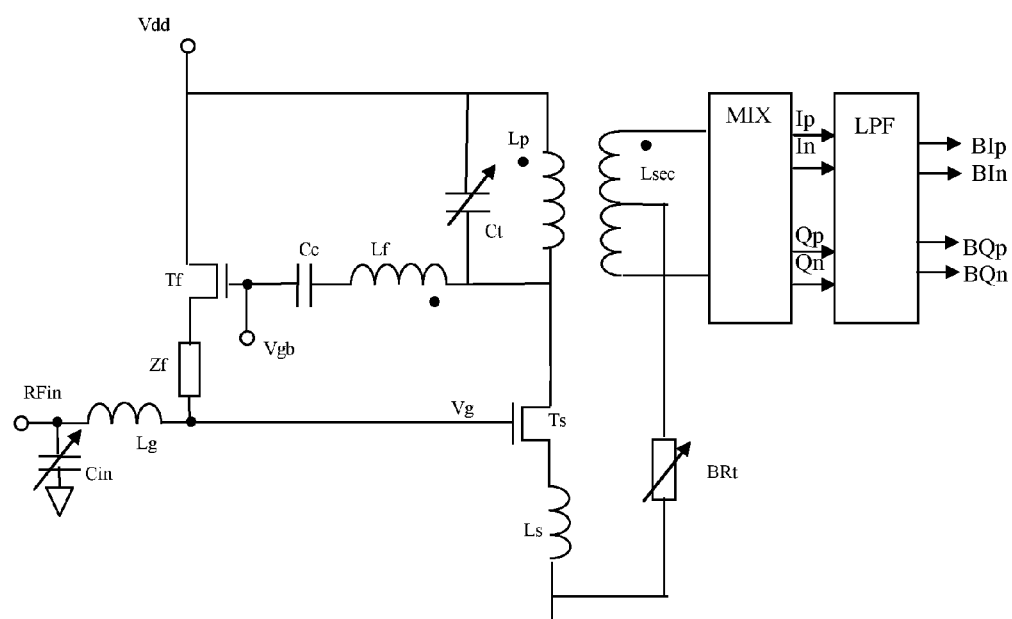
FIG. 5 shows a first embodiment of an RF receiver front-end with a single-ended low noise amplifier utilizing a self-coupled transformer.

In the above-mentioned embodiments shown in FIGS. 2, 3 and 4, the RF receiver front end includes a differential low noise amplifier stage. However, the same idea of using a self-coupled step-up transformer for providing feedback can also be used in a single-ended low noise amplifier stage. The conversion to differential signals can then take place in an output balun instead of the input balun used in the embodiments above. An example of this is shown in FIG. 5. The input RF signal RFin is fed to the gate terminal of the transistor Ts configured in a common source configuration through the inductor Lg. The tunable shunt capacitor Cin is used to compensate return reflection coefficient. The source node of transistor Ts is connected to ground through the source degeneration inductor Ls, which provides current feedback to the low noise amplifier. This current feedback helps to improve linearity of the low noise amplifier. The output of transistor Ts is loaded by a primary inductor winding Lp of the self-coupled transformer connected to the power supply Vdd. The tunable capacitor Ct is connected across the primary inductor winding Lp and tuned to the wanted RF frequency of the receiver. An output balun is formed by the primary inductor winding Lp and a secondary inductor winding Lsec having a center tap connected to ground through a tunable impedance BRt. The tunable impedance BRt is employed to remove the imbalance introduced by the balun when it performs a conversion from a single-ended signal to differential signals. The balun outputs are then coupled to the mixer MIX.

To improve input match bandwidth, feedback is formed via transistor Tf configured as a source follower and feedback impedance Zf1. A self-coupled step-up transformer as described above is used, which consists of the primary inductor winding Lp and a self-coupled step-up inductor winding Lf. In this way the voltage gain in the feedback path is boosted without damaging the low noise amplifier outputs linearity because the output swing of the low noise amplifier is kept low. The capacitor Cc is used for AC coupling. Vgb is a bias voltage, and it can be tuned to a proper operation point for transistors Ts and Tf. Similarly to FIGS. 3 and 4, also in this single-ended version the source follower Tf and the source degeneration inductor may be removed.

Figure 6:
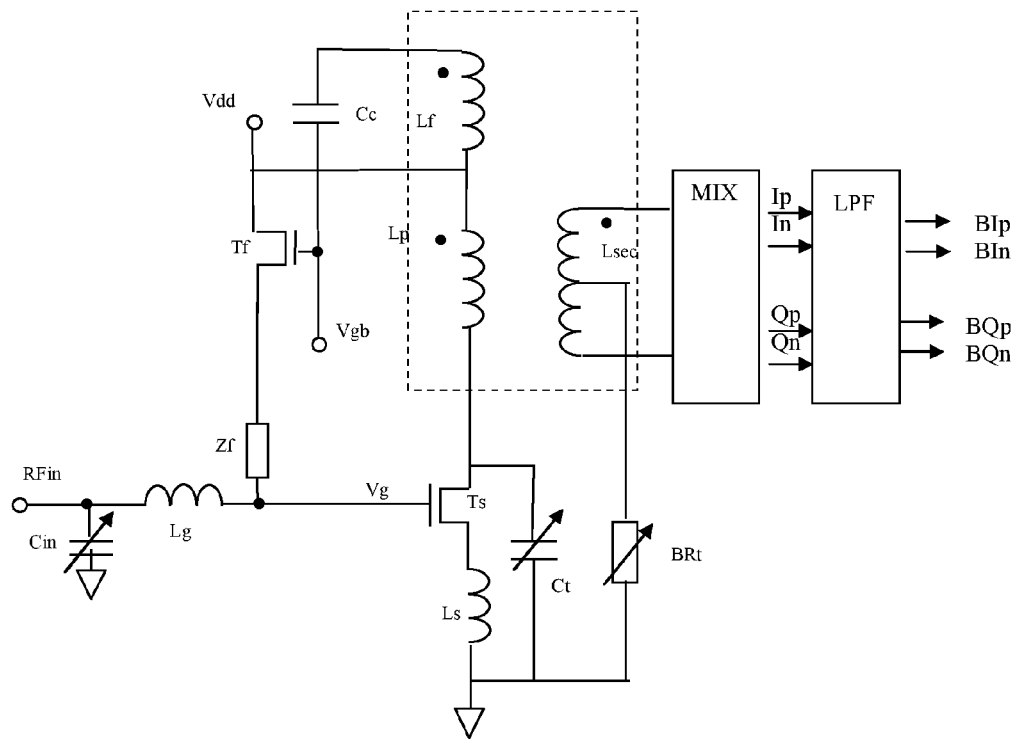
FIG. 6 shows a second embodiment of an RF receiver front-end with a single-ended low noise amplifier utilizing a self-coupled transformer.

FIG. 6 shows an embodiment that is slightly different from the embodiment of FIG. 5. One difference is that in FIG. 6 the tunable capacitor Ct is connected to ground instead of to the supply voltage Vdd. Since both Vdd and ground can be considered as an AC ground the two ways of connecting Ct are equivalent. Another difference is that in FIG. 6 the feedback path with the self-coupled inductor winding Lf is connected to the supply voltage Vdd instead of the output terminal of transistor Ts. In this way the output node of the transistor has less parasitic capacitive load introduced by the winding Lf, since in practice Lf has parasitic capacitance to the ground. If Lp has np turns and Lf has nf turns, then the voltage gain is nf/np, and this gain is smaller than in FIG. 5, where the voltage gain is (nf+np)/np.

Figure 7:
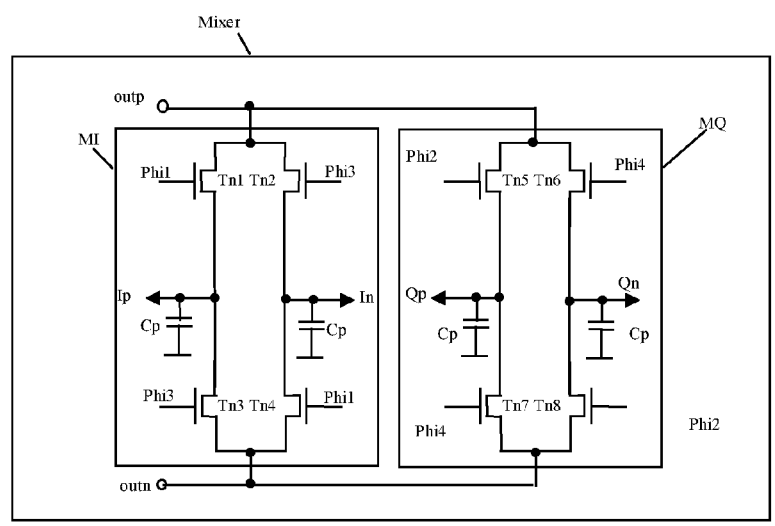
FIG. 7 shows an example of a passive mixer for the RF receiver front-end of FIGS. 2 to 6.

An example of a passive mixer MIX shown in the previous figures can be plotted in FIG. 7. Transistors Tn1-Tn4 form an in-phase mixer MI, and transistors Tn5-Tn8 form a quadrature-phase mixer MQ. MI and MQ are driven by 4-phase quadrature clocks, Phi1, Phi2, Phi3 and Phi4, with a duty cycle about 25%. Each of these quadrature clocks has 90 degree phase shift comparing a previous or next clocks. To reach a better linearity, the mixer should work in a low impedance mode where the equivalent output impedances of both low noise amplifier and mixer are low.

The four capacitors Cp inside MIX provide first order frequency selectivity at low noise amplifier outputs, giving different load impedance at different frequency. In fact a first order pole is created, and this pole is determined by the output impedance of the low noise amplifier in series with the conducting impedance of the mixer multiplied by the capacitance Cp. This first order pole creates a first order low pass filter function. For in-band signals, capacitors Cp reflect back to the low noise amplifier side with very high impedance, while for out-band interference or block signals, capacitors Cp reflect back to the low noise amplifier side with low impedance that loads the low noise amplifier outputs heavily and thus reduces the gain for the out-band interference or block signals.

Figure 8A:
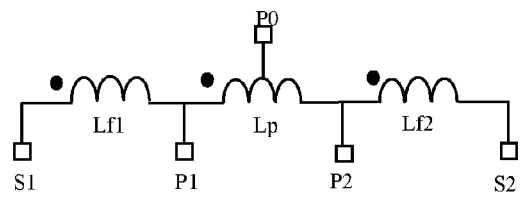
FIGS. 8a, 8b and 8c show an implementation of a self-coupled transformer.
Figure 8B:
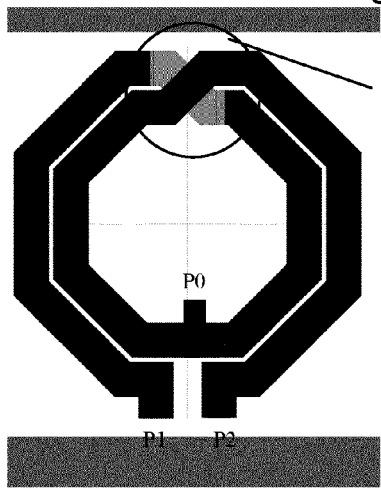
Figure 8C:
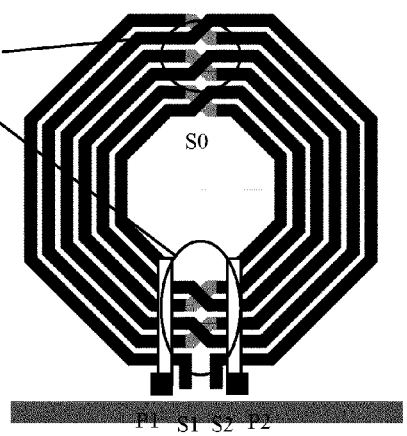

The self-coupled step-up transformer is easy to implement, as the windings Lf1 and Lf2 for voltage boost do not require a high Q. An example of layout of a self-coupled transformer built with metal stack can be seen in FIG. 8a-c. FIG. 8a shows the electric diagram of the self-coupled transformer, while FIGS. 8b and 8c show the primary winding and the secondary windings, respectively. In the implementation the primary winding and the secondary windings are stacked one over the other. The primary winding Lp of the transformer is a high Q inductor, and the windings Lf1 and Lf2 for voltage boost can be implemented with thin metal wires such as shown in FIG. 8c. So there is no extra space required for the windings. In the single-ended embodiments shown in FIGS. 5 and 6 the self-coupled transformer can be implemented similarly; the only differences being that there is only one secondary winding and that the primary winding does not have a center tap. In another embodiment, the self-coupled step-up transformer can be replaced with a normal transformer to reach the same goal, but a bit worse in performance as the Q and coupling coefficient in a normal transformer is lower than the self-coupled transformer. A drawing of the normal transformer is not shown, but any person skilled in the art should know how to make the variation.

Figure 9:
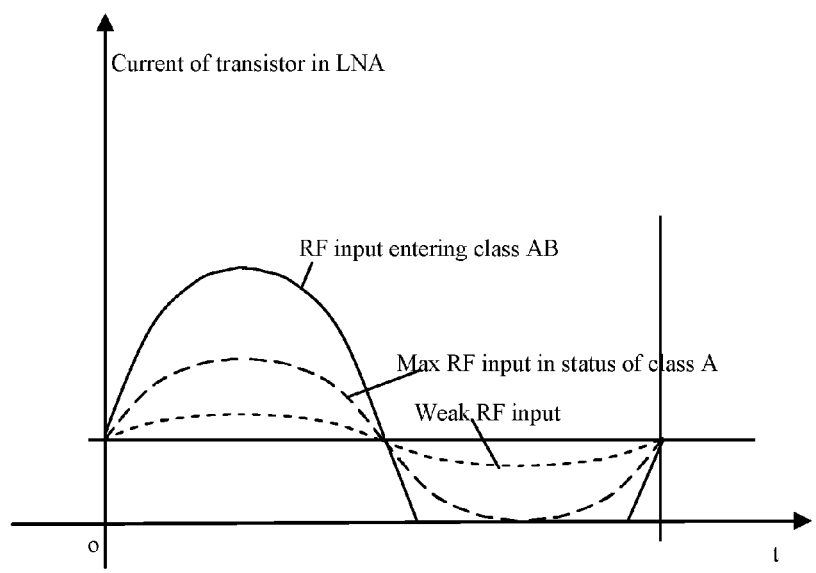
FIG. 9 shows how the low noise amplifier can shift from operation in class A to operation in class AB in case of large RF interference.

The bias method shown in FIGS. 3, 4 and 5 allows the low noise amplifier stage to automatically increase the current in presence of large RF interference, thus extending the linear region of the low noise amplifier. In some embodiments, this is achieved by employing a differential low noise amplifier and differential inductance load at the low noise amplifier output. In the differential embodiments, the suggested low noise amplifier shifts operation status in presence of large RF interference from class A to class AB, as it is illustrated in FIG. 9, or even to class B or C.

Although various embodiments of the present invention have been described and shown, the invention is not restricted thereto, but may also be embodied in other ways within the scope of the subject-matter defined in the following claims.

The invention claimed is:

1. A low noise amplifier comprising:
    at least one amplifying transistor configured in a common source configuration to receive an input signal at a gate terminal and provide an amplified signal at a drain terminal;
    at least one feedback path arranged to couple a part of the amplified signal back to the gate terminal and comprising a feedback impedance;
    a self-coupled step-up transformer comprising:
        at least one primary winding connected to a supply voltage and the drain terminal of the at least one amplifying transistor; and
        at least one self-coupled secondary inductor winding arranged in the feedback path.

2. The low noise amplifier of claim 1, further comprising a tuneable capacitor coupled to form a resonant circuit with the at least one primary winding, the resonant circuit having a predefined resonant frequency.

3. The low noise amplifier of claim 1, wherein each feedback path comprises a transistor configured as a source follower.

4. The low noise amplifier of claim 1, wherein each feedback path comprises a capacitor providing AC coupling in the feedback path.

5. The low noise amplifier of claim 1, wherein a source terminal of each amplifying transistor is connected to ground through an inductor.

6. The low noise amplifier of claim 1, wherein the self-coupled step-up transformer is implemented as a metal stack with primary and secondary windings stacked one over the other.

7. The low noise amplifier of claim 1:
    wherein the low noise amplifier is a differential amplifier having two amplifying transistors configured in a common source configuration, each transistor having a feedback path;
    wherein the self-coupled step-up transformer comprises:
        a center tap of the primary winding connected to a supply voltage;
        two self-coupled inductor windings, each self-coupled inductor winding disposed in one of the feedback paths.

8. The low noise amplifier of claim 7, further comprising a balun circuit configured to convert a single ended input signal to differential signals and to supply the differential signals to the gate terminals of the amplifying transistors.

9. The low noise amplifier of claim 7, wherein the low noise amplifier is configured to shift operation status from class A to class AB in presence of large RF interference.

10. A radio frequency front end receiver, comprising:
    a low noise amplier, the low noise amplifier comprising:
        at least one amplifying transistor configured in a common source configuration to receive an input signal at a gate terminal and provide an amplified signal at a drain terminal;
        at least one feedback path arranged to couple a part of the amplified signal back to the gate terminal and comprising a feedback impedance;
        a self-coupled step-up transformer comprising:
            at least one primary winding connected to a supply voltage and the drain terminal of the at least one amplifying transistor; and
            at least one self-coupled secondary inductor winding arranged in the feedback path.

11. The radio frequency front end receiver of claim 10, wherein the low noise amplifier further comprises a tuneable capacitor coupled to form a resonant circuit with the at least one primary winding, the resonant circuit having a predefined resonant frequency.

12. The radio frequency front end receiver of claim 10, wherein each feedback path comprises a transistor configured as a source follower.

13. The radio frequency front end receiver of claim 10, wherein each feedback path comprises a capacitor providing AC coupling in the feedback path.

14. The radio frequency front end receiver of claim 10, wherein a source terminal of each amplifying transistor is connected to ground through an inductor.

15. The radio frequency front end receiver of claim 10, wherein the self-coupled step-up transformer is implemented as a metal stack with primary and secondary windings stacked one over the other.

16. The radio frequency front end receiver of claim 10:
   wherein the low noise amplifier is a differential amplifier having two amplifying transistors configured in a common source configuration, each transistor having a feedback path;
   wherein the self-coupled step-up transformer comprises:
      a center tap of the primary winding connected to a supply voltage;
      two self-coupled inductor windings, each self-coupled inductor winding disposed in one of the feedback paths.

17. The radio frequency front end receiver of claim 16, wherein the low noise amplifier further comprises a balun circuit configured to convert a single ended input signal to differential signals and to supply the differential signals to the gate terminals of the amplifying transistors.

18. The radio frequency front end receiver of claim 16, wherein the low noise amplifier is configured to shift operation status from class A to class AB in presence of large RF interference.

* * * * *

UNITED STATES PATENT AND TRADEMARK OFFICE
CERTIFICATE OF CORRECTION

| | | |
|---|---|---|
| PATENT NO. | : 8,965,322 B2 | Page 1 of 1 |
| APPLICATION NO. | : 13/992804 | |
| DATED | : February 24, 2015 | |
| INVENTOR(S) | : Mu | |

It is certified that error appears in the above-identified patent and that said Letters Patent is hereby corrected as shown below:

IN THE SPECIFICATION

In Column 6, Line 57, delete "has of" and insert -- has nf --, therefor.

In Column 6, Line 58, delete "of/np," and insert -- nf/np, --, therefor.

IN THE CLAIMS

In Column 8, Line 39, in Claim 10, delete "amplier," and insert -- amplifier, --, therefor.

Signed and Sealed this
Thirteenth Day of October, 2015

Michelle K. Lee
*Director of the United States Patent and Trademark Office*